(12) United States Patent
Jung et al.

(10) Patent No.: US 7,969,812 B2
(45) Date of Patent: Jun. 28, 2011

(54) SEMICONDUCTOR CONTROL LINE ADDRESS DECODING CIRCUIT

(75) Inventors: Chulmin Jung, Eden Prairie, MN (US); Dadi Setiadi, Edina, MN (US); YoungPil Kim, Eden Prairie, MN (US); Harry Hongyue Liu, Maple Grove, MN (US); Hyung-Kyu Lee, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 161 days.

(21) Appl. No.: 12/502,219

(22) Filed: Jul. 13, 2009

(65) Prior Publication Data

US 2011/0007597 A1 Jan. 13, 2011

(51) Int. Cl.
*G11C 8/00* (2006.01)

(52) U.S. Cl. .............................. 365/230.06; 365/230.02

(58) Field of Classification Search .............. 365/230.06, 365/230.02
See application file for complete search history.

(56) References Cited

U.S. PATENT DOCUMENTS

| | | | |
|---|---|---|---|
| 5,369,621 A | 11/1994 | Mason | |
| 5,432,719 A | 7/1995 | Freeman et al. | |
| 5,436,574 A | 7/1995 | Veenstra | |
| 5,438,295 A | 8/1995 | Reddy et al. | |
| 5,488,316 A | 1/1996 | Freeman et al. | |
| 5,831,903 A * | 11/1998 | Ohuchi et al. | 365/185.22 |
| 5,854,772 A | 12/1998 | Suzu | |
| 5,886,942 A * | 3/1999 | Akita | 365/230.06 |
| 6,153,468 A | 11/2000 | Forbes et al. | |
| 6,288,941 B1 * | 9/2001 | Seki et al. | 365/185.12 |
| 6,351,152 B1 | 2/2002 | Reddy et al. | |
| 6,834,004 B2 | 12/2004 | Takano et al. | |
| 7,378,879 B1 | 5/2008 | De La Cruz et al. | |
| 2005/0141306 A1 * | 6/2005 | Hatakeyama et al. | 365/203 |

* cited by examiner

*Primary Examiner* — Tuan T. Nguyen

(74) *Attorney, Agent, or Firm* — Fellers, Snider, et al.

(57) ABSTRACT

Apparatus and method for decoding addresses of control lines in a semiconductor device, such as a solid state memory (SSM). In accordance with some embodiments, a switching circuit includes an array of switching devices coupled to $2^N$ output lines and M input lines, wherein M and N are respective non-zero integers and each output line has a unique N-bit address. A decoder circuit coupled to the switching circuit divides the N-bit address for a selected output line into a plurality of multi-bit subgroup addresses, and asserts the M input lines in relation to respective bit values of said subgroup addresses to apply a first voltage to the selected output line and to concurrently apply a second voltage to the remaining $2^N-1$ output lines.

20 Claims, 8 Drawing Sheets

US 7,969,812 B2

SEMICONDUCTOR CONTROL LINE ADDRESS DECODING CIRCUIT

BACKGROUND

Solid state memories (SSMs) provide an efficient mechanism for storing and transferring data in a wide variety of applications, such as hand-held portable electronic devices. Individual memory cells within such memories can be volatile or non-volatile, and can store data by the application of suitable write currents to the cells to store a sequence of bits. The stored bits can be subsequently read during a read access operation by applying suitable read currents and sensing voltage drops across the cells.

The selection of specific memory cells in an SSM array can require complex circuitry with large numbers of interconnects and decoding logic elements to resolve individual data addresses. The complexity of such circuitry generally increases significantly as array size is increased.

As system designers seek to design SSM arrays with ever increased data storage capacities, including multi-layer 3D integrated arrays, the manufacturing costs of the associated selection circuitry, as well as the amount of overhead area required to accommodate the circuitry, generally increases as well.

SUMMARY

Various embodiments of the present invention are generally directed to an apparatus and method for decoding addresses of control lines in a semiconductor device, such as a solid state memory (SSM).

In accordance with some embodiments, a switching circuit comprises an array of switching devices coupled to $2^N$ output lines and M input lines, wherein M and N are respective non-zero integers and each output line has a unique N-bit address. A decoder circuit coupled to the switching circuit divides the N-bit address for a selected output line into a plurality of multi-bit subgroup addresses, and asserts the M input lines in relation to respective bit values of said subgroup addresses to apply a first voltage to the selected output line and to concurrently apply a second voltage to the remaining $2^N-1$ output lines.

These and other features and advantages which characterize the various embodiments of the present invention can be understood in view of the following detailed discussion and the accompanying drawings.

DETAILED DESCRIPTION

The present disclosure generally relates to the selection of a particular output line out of a plurality of such lines in a semiconductor device, such as control lines (e.g., word lines, bit lines, etc.) in a solid state memory (SSM) array. Prior art decoding circuits often utilize complex structures that require burdensome processing time and large a real extents to effect the selection of individual control lines. Moreover, some existing methodologies cannot easily or reliably isolate a selected output line when multiple planes of circuitry are vertically stacked, as in a multi-layer 3D memory array.

Accordingly, as explained below various embodiments are directed to a control line address decoding circuit that utilizes a decoder that breaks down a unique multi-bit address for a selected output line into a plurality of multi-bit subaddresses. The decoder selectively asserts a number of input lines in relation to the bit values of the subaddresses. In response, a switching circuit asserts the selected output line with a first selected voltage value, such as $V_{DD}$, and concurrently asserts all of the remaining, non-selected output lines with a second selected voltage value, such as electrical ground.

Figure 1:
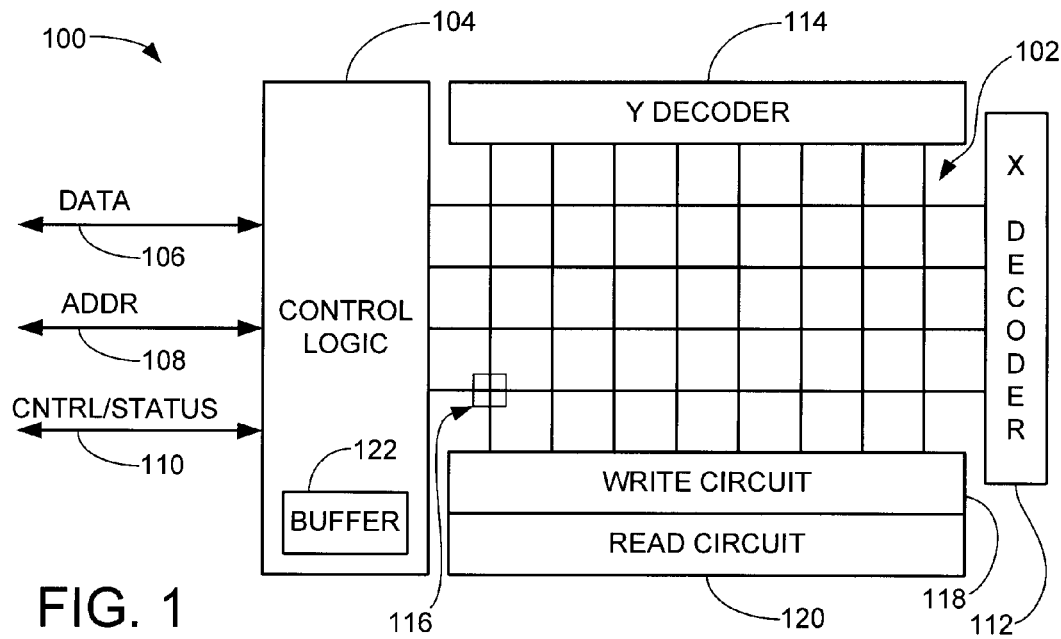
FIG. 1 is a general representation of a solid state memory (SSM) data storage device.

Turning to the drawings, FIG. 1 provides a generalized representation of an exemplary data storage circuit 100 used to read and write data to an SSM space. Data are stored as an arrangement of rows and columns of memory cells 102, which are accessible by various row and column lines, such as word lines, bit lines and source lines. The actual configurations of the cells and the access lines thereto will depend on the requirements of a given application. Generally, however, it will be appreciated that the various control lines will generally include enable lines that selectively enable and disable the respective writing and reading of the programmed value (s) of the individual cells.

Control logic 104 receives and transfers data, addressing information and control/status values along multi-line bus paths 106, 108 and 110, respectively. X and Y decoding circuits 112, 114 provide appropriate switching and other functions to access the various cells 102. During operation, the X and Y decoding circuits selectively isolate a selected memory cell, such as exemplary cell 116, thereby activating the selected memory cell for a data access operation, such as a read operation or a write operation.

A write circuit 118 operates to carry out write operations to write data to the cells 102, and a read circuit 120 correspondingly operates to obtain readback data from the cells. Local buffering of transferred data and other values can be provided via one or more local registers 122. At this point it will be appreciated that the circuitry of FIG. 1 is merely exemplary in nature, and any number of alternative configurations can readily be employed as desired depending on the requirements of a given application.

Figure 2:
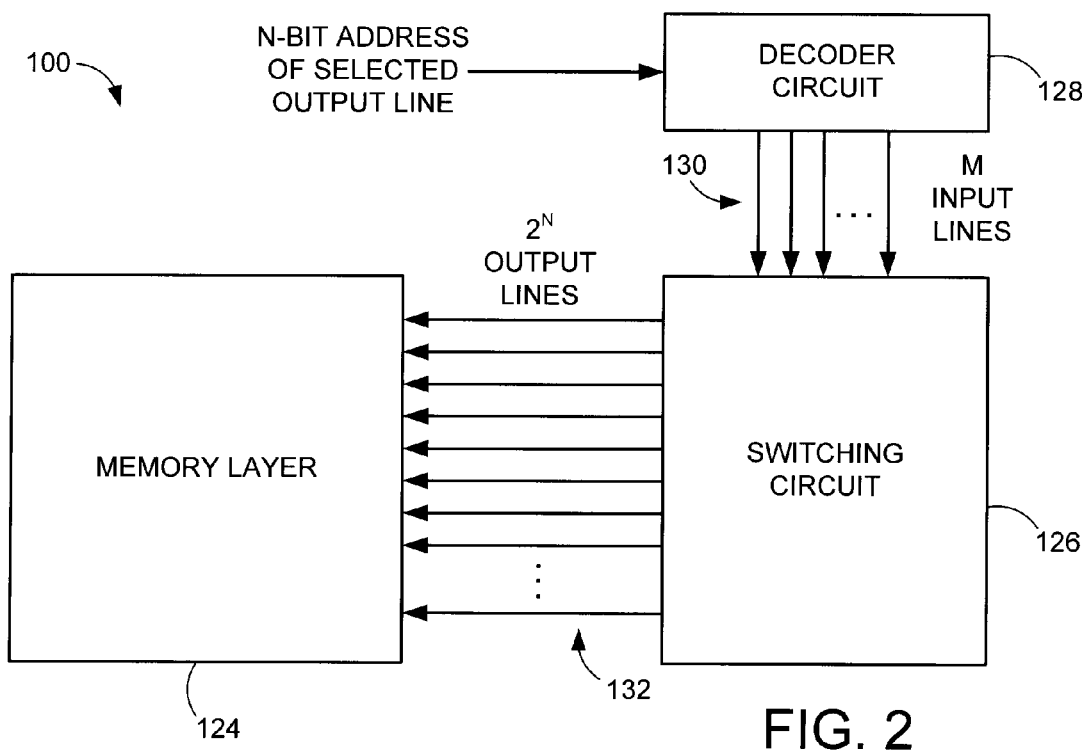
FIG. 2 displays an exemplary functional diagram of decoding circuitry of FIG. 1 in accordance with various embodiments of the present invention.

FIG. 2 displays a functional representation of relevant portions of the circuitry 100 of FIG. 1. FIG. 2 includes a memory layer 124, a switching circuit 126 and a decoder 128. The switching circuit 126 and decoder 128 can be incorporated into the respective X and Y decoders 112, 114 of FIG. 1. Aspects of these functional blocks can be alternatively incorporated into the control logic 104 of FIG. 1.

The switching circuit 126 has M input lines 130 and $2^N$ output lines 132. The values M and N can be any suitable non-zero integers, and are generally selected in relation to the data capacity of the memory layer 124. In some embodiments, M will be greater than N and less than $2^N$.

The output lines 132 are coupled to respective rows or columns of the memory cells in the memory layer 124. For example, each of the output lines 132 may correspond to a separate word line (WL) connected to gate regions of switching devices of the memory cells along each row. Each of the output lines 132 may alternatively correspond to a separate bit line (BL) or source line (SL) connected to the memory cells along each column. Other arrangements for the various output lines may also be used.

During a particular access operation it may be desirable to provide a selected output line 132 with a first voltage, such as $V_{DD}$=+3.0V, and to provide the remaining output lines with a second voltage, such as ground ($V_{SS}$=0V).

Each of the $2^N$ output lines 132 is provided with a unique N-bit address to uniquely identify the associated output line in turn. For example, if 4096 output lines are provided, each output line can be uniquely identified by a 12 bit address word. In this case N would be equal to 12, $2^N$ would be equal to 212=4096, and the addresses for the individual output lines would range from 000000000000 to 111111111111. Other addressing schemes can be utilized as desired, so this is merely for purposes of illustration and is not limiting.

In order to provide the first voltage to a selected output line 132, the unique N-bit address for the selected output line is provided to the decoder 128. As explained in greater detail below, the decoder 128 divides the received N-bit address into a plurality of multi-bit subgroup addresses, and activates the M input lines 130 in relation to the respective bit values of these subgroup addresses.

Switching devices within the switching circuit 126 are selectively activated responsive to the voltages impressed upon the M input lines so that the selected output line is provided with the first voltage (e.g., $V_{DD}$) and the remaining 2N-1 output lines are provided with the second voltage (e.g., ground).

Figure 3:
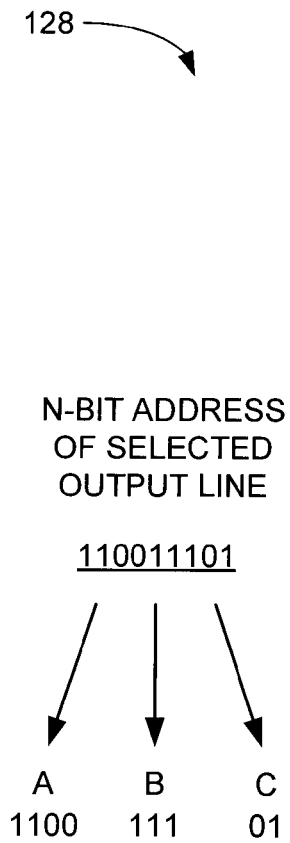
FIG. 3 shows a diagrammatical representation of the operation of the decoder block in FIG. 2.
Figure 3:
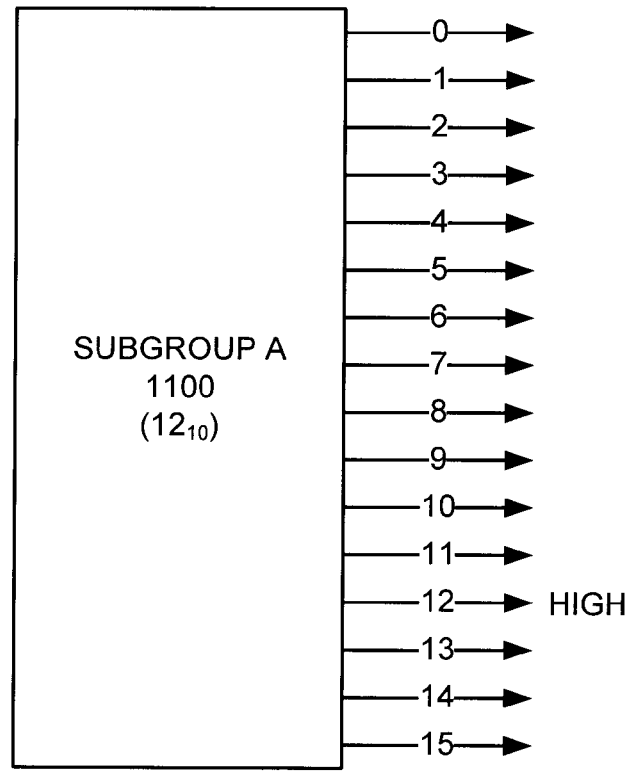
Figure 3:
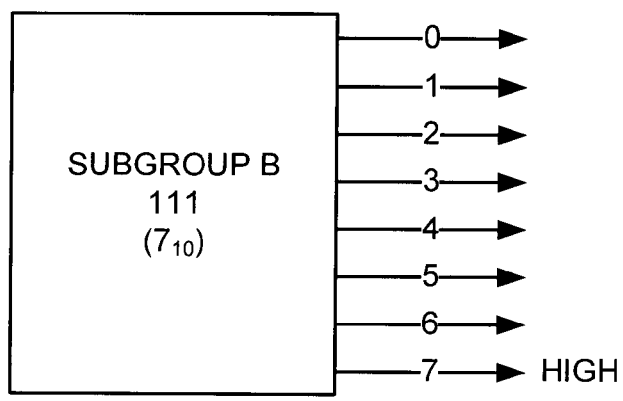
Figure 3:
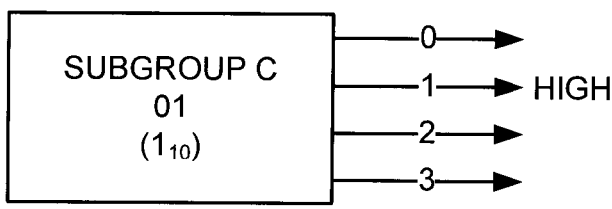

FIG. 3 provides an example of the operation of the decoder 126 in accordance with some embodiments. In this example, assume that a total of $2^9$=512 output lines are provided by the switching circuit 126 in FIG. 2. The N-bit address supplied to the decoder 128 is the 9-bit word 110011101. This corresponds to output line number 413 out of the total 512 output lines ($110011101_2$=$413_{10}$).

As shown in FIG. 3, the decoder breaks this 9-bit word into the following subgroup (SG) addresses: A=1100, B=111 and C=01. It will be appreciated that other groupings can be used. The subgroups A, B and C are ranked from most significant bits (MSBs) to least significant bits (LSBs) of the N-bit address, although such is not necessarily required.

The M input lines are thereafter activated by the decoder 128 in relation to these bit values. In FIG. 3, the M input lines include 16 input lines (numbered 0-15) for the first subgroup A (since $2^4$=16), a total of 8 input lines (numbered 0-7) for the second subgroup B ($2^3$=8), and a total of 4 input lines (numbered 0-3) for the last two bits of the third subgroup C ($2^2$=4).

Of these respective sets of input lines, a selected one from each group is asserted HIGH (e.g., $V_{DD}$); for example, A line 12 (A12) is asserted HIGH (since $1100_2$=$12_{10}$), B7 is asserted HIGH ($111_2$=$7_{10}$), and C1 is asserted HIGH ($01_2$=$1_{10}$). Although not separately indicated, the remaining input lines shown in FIG. 3 are asserted LOW (e.g., ground). Any number of circuits, including the use of various CMOS logic, can be utilized to provide this functionality. Additional input lines may also be provided by the decoder circuit 128, as explained below.

Figure 4:
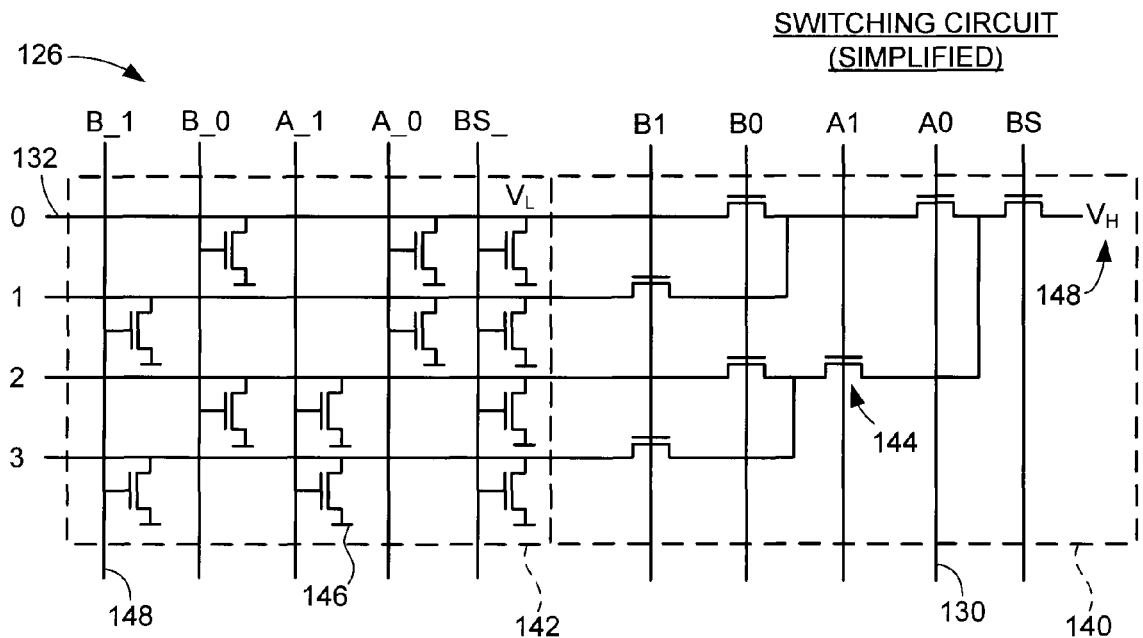
FIG. 4 is a simplified functional representation of the switching circuit in FIG. 2.

The construction and operation of the switching circuit 126 in FIG. 2 will now be discussed beginning with FIG. 4. It will be appreciated that FIG. 4 is a highly simplified arrangement with a limited number of input and output lines to initially demonstrate features of various embodiments. The simplified circuitry of FIG. 4 has four (4) output lines 132 denoted 0-3, and a total of 10 input lines 130. However, it is contemplated that larger, more typical array sizes with thousands of output lines 132 can be accommodated using merely dozens of input lines 130.

The input lines 130 supplied to the circuitry of FIG. 4 include lines A0, A1, B0, B1 and BS (block select). Each of these lines can either be asserted HIGH or asserted LOW by the decoder circuit depending on the selected output line 132. The M input lines 130 further include complementary lines A_0, A_1, B_0, B_1 and BS_. Thus, if the line A0 is asserted HIGH, the line A_0 will be asserted LOW, and vice versa. The same is true for each of the remaining complementary pairs of input lines 130.

The lines A0, A1, B0, B1 and BS are coupled to a HIGH voltage $V_H$ stage 140 (shown by a first dotted line enclosure), and the complementary lines A_0, A_1, B_0, B_1 and BS_ are coupled to a LOW voltage $V_L$ stage 142 (second dotted line enclosure).

The switching circuit 126 includes a number of switching devices 144. The switching devices 144 are arranged such that the input lines 130 control the gate voltage and consequently the amount of current passing through the drain-source junction of each device 144. In some embodiments, the switching devices 144 are constructed as n-type metal oxide semiconductor field effect transistors (nMOSFETs). Cross-bars 146 in the LOW voltage $V_L$ stage 142 denote connection to a ground (0V) plane.

The various output lines 132 are selected in relation to the selective assertion of the input lines 130. For example, to assert a HIGH value on output line 2 (and a LOW value on remaining output lines 0, 1 and 3), input line BS is set HIGH, A0 is set LOW, A1=HIGH, B0=HIGH and B1=LOW. It can be seen that current will flow from a HIGH ($V_H$) voltage source 148 to the selected output line 2, and each of the remaining output lines 0, 1 and 3 will be pulled LOW ($V_L$) via connection to the source plane 146.

Each of the four output lines 132 in FIG. 5 has a unique 2-bit address: 00, 01, 10 or 11. It follows that the input lines A0 and A1 correspond to a first (MSB) subgroup address, and the input lines B0 and B1 correspond to a second (LSB) subgroup address in accordance with the discussion of FIG. 4. As noted above in the foregoing example, to select output line 2 (with address $10_2$) the LSB bit "0" was used to set B0=HIGH and B1=LOW, and the LSB bit "1" was used to set A1=HIGH and A0=LOW. The selection of other output lines would be carried out in similar fashion; for example, to select output line 0 (with address $00_2$), the LSB bit "0" would set B0=HIGH and B1=LOW, and the MSB bit "0" would similarly set A0=HIGH and A1=LOW.

As noted above, the simplified example for the switching circuitry 126 in FIG. 4 results in the use of ten (10) input lines to select four (4) output lines. This is not terribly efficient. However, larger more typical array sizes (such as 1024×32, etc.) will tend to result in a significantly greater number of output lines 132 as compared to the number of input lines 130. Thus, the actual amount of metallization and number of switching devices (e.g., MOSFETs 144) can be significantly reduced as compared to prior art selection circuit designs.

Figure 5A:
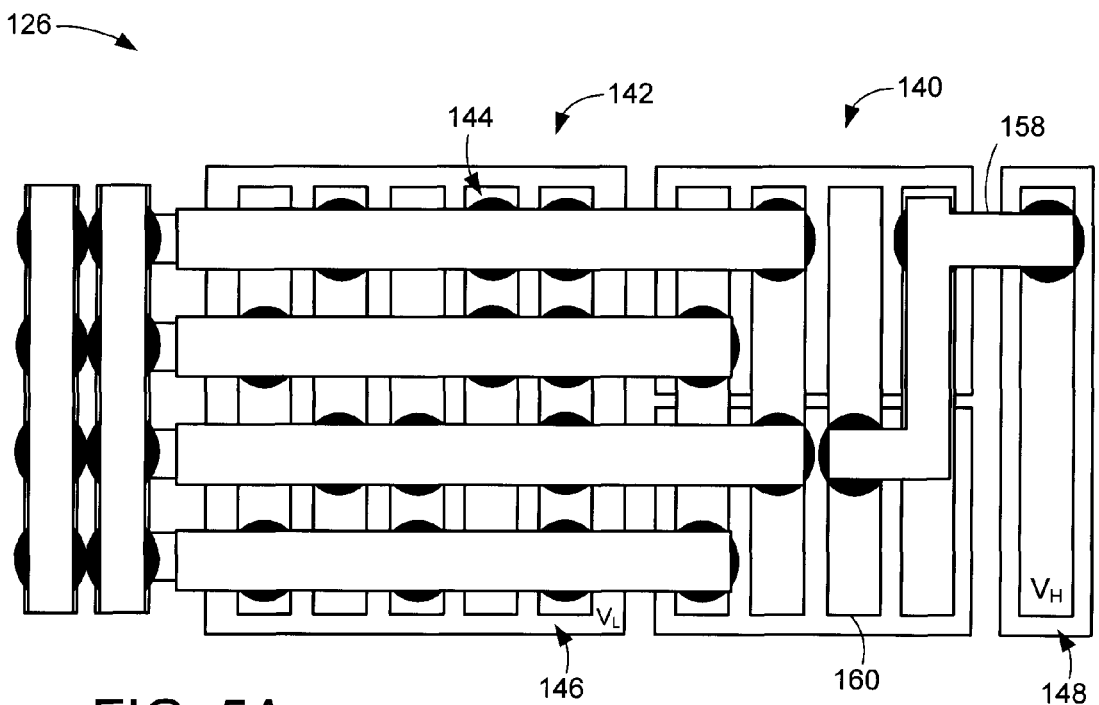
FIGS. 5A-5B generally illustrate various views of the switching circuit of FIG. 2.
Figure 5B:
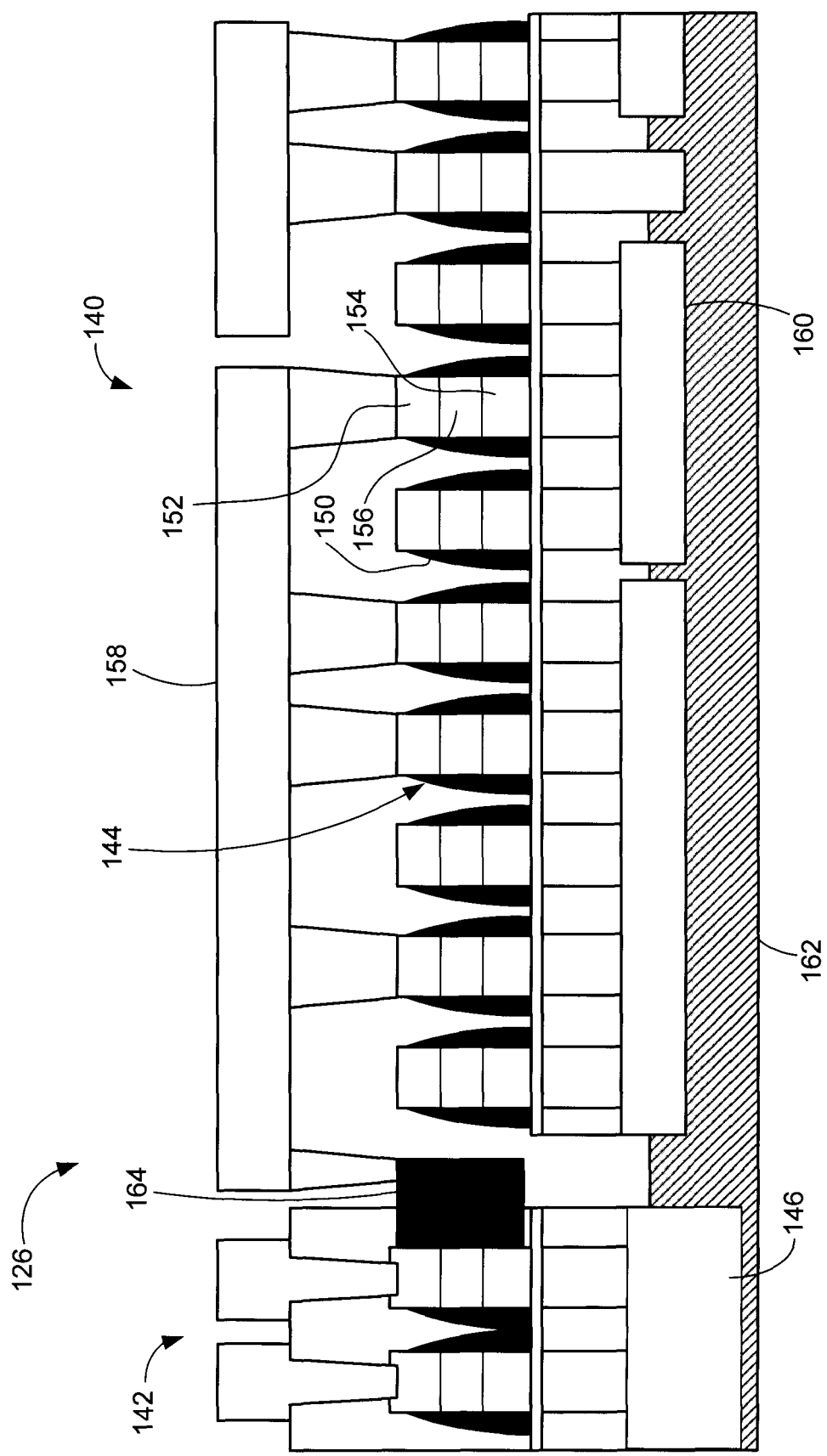

FIGS. 5A and 5B provide exemplary top plan and side elevational representations of the switching circuit 126 of FIG. 4 to illustrate one manner in which the various interconnections can be established in a compact and easily manufactured fashion. The MOSFETs 144 can be provided with a vertically stacked configuration with gate region 150, source region 152, drain region 154 and channel region 156.

Conductive lines 158 and 160 can be extended above and below the MOSFETs 144 to provide the various interconnections shown in FIG. 4 relative to an underlying substrate layer 162. Bridging blocks 164 provide interconnections between the high and low voltage stages 140, 142. As desired, the circuit can utilize different sized switching devices 144 in different locations to better utilize available physical space and current load requirements.

Figure 6:
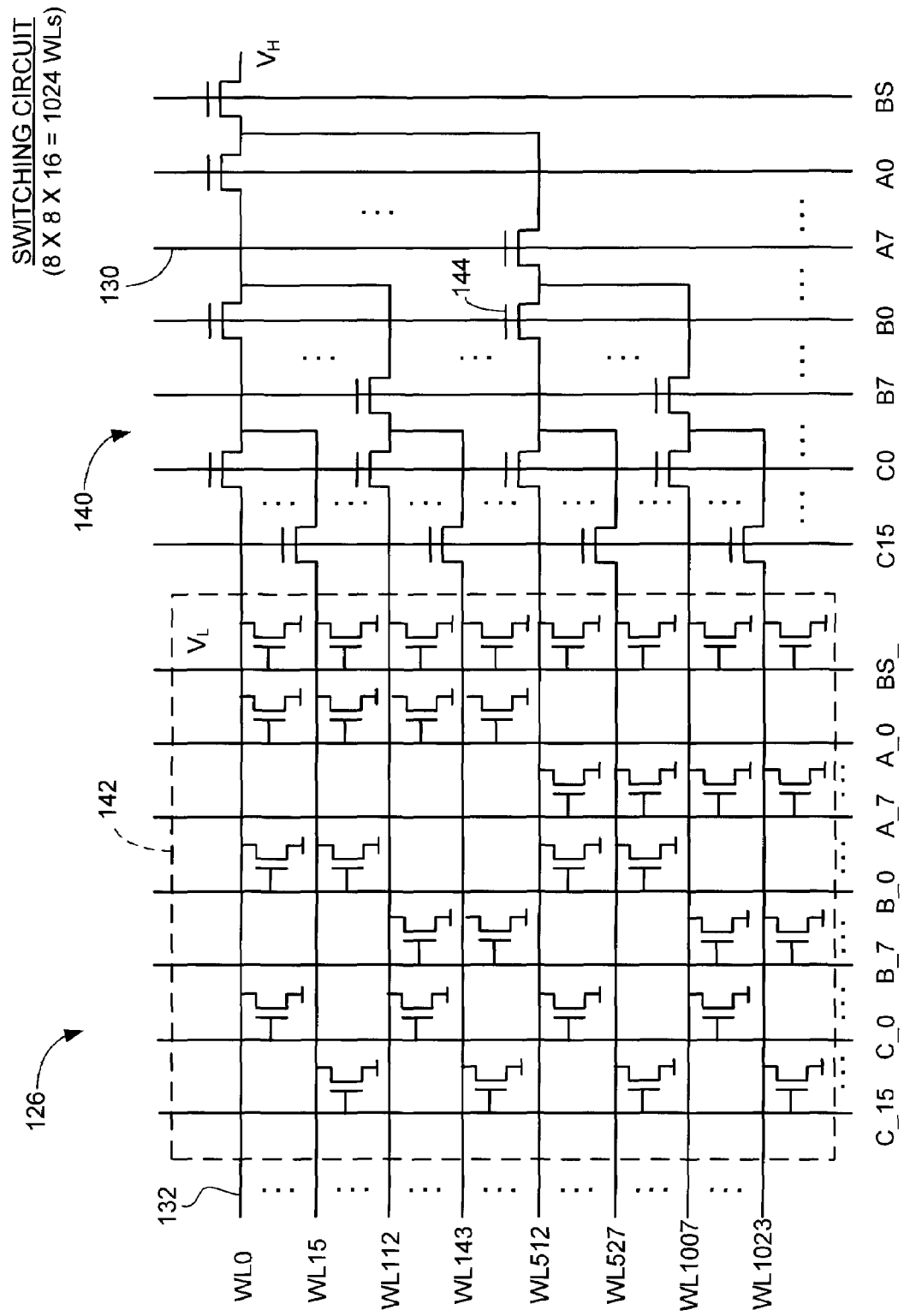
FIG. 6 provides an alternative configuration for the switching circuit of FIG. 2.

FIG. 6 shows another schematic representation of the switching circuit 126 of FIG. 2. The circuitry in FIG. 6 is configured to accommodate the individual selection of 1024 separate output lines 132 characterized as word lines (WL0 to WL1023). Each of the word lines 132 has a unique 10-bit address ($2^{10}=1024$). The decoding circuitry 128 (FIG. 2) associated with FIG. 6 breaks the 10-bit address into three subgroups: the first three MSBs form subgroup A, the next three bits form subgroup B and the last four LSBs form subgroup C.

These subgroups correspond to input lines A0 through A7, B0 through B7 and C0 through C15. Complementary input lines A_0 through A_7, B_0 through B_7 and C_0 through C_15 are also shown, as well as complementary block select lines BS and BS_. As will be appreciated, only selected ones of these input lines are shown in FIG. 6 due to space constraints.

As before, the word lines 132 are individually asserted in relation to the corresponding N-bit addresses for such lines. Table 1 shows each of the respective A, B and C subgroup addresses, as well as the asserted A, B and C input lines, for the various output lines WL0-WL1023 in FIG. 6:

TABLE 1

| WL | A | B | C | LINE A | LINE B | LINE C |
|---|---|---|---|---|---|---|
| WL0 | 000 | 000 | 0000 | A0 | B0 | C0 |
| WL15 | 000 | 000 | 1111 | A0 | B0 | C15 |
| WL112 | 000 | 111 | 0000 | A0 | B7 | C0 |
| WL127 | 000 | 111 | 1111 | A0 | B7 | C15 |
| WL896 | 111 | 000 | 0000 | A7 | B0 | C0 |
| WL911 | 111 | 000 | 1111 | A7 | B0 | C15 |
| WL1008 | 111 | 111 | 0000 | A7 | B7 | C0 |
| WL1023 | 111 | 111 | 1111 | A7 | B7 | C15 |

It will be appreciated that similar addressing is applied for other output lines 132 not specifically shown in FIG. 6. For example, WL425 would have a 10-bit address of 0110101001, which resolves to A=011, B=010 and C=1001. The associated input lines asserted HIGH by the decoder circuit 126 (FIG. 2) would thus be A3, B2 and C1.

Accordingly, FIG. 6 demonstrates that a total of 1024 output lines ($2^{10}$) can be individually selected, and the remaining lines can be pulled low, using a mere 66 input lines (32 A, B and C lines, 32 complementary A_, B_ and C_ lines, and two BS lines). While the 10-bit addresses for the 1024 word lines 132 in FIG. 6 are broken into 8×8×16 subgroups A, B and C, other divisions are readily envisioned. For example, the 10-bit addresses could alternatively be broken into A, B, C and D divisions of 8×8×4×4 lines, and associated arrangements of the switching devices and interconnects could be provided accordingly.

Figure 7:
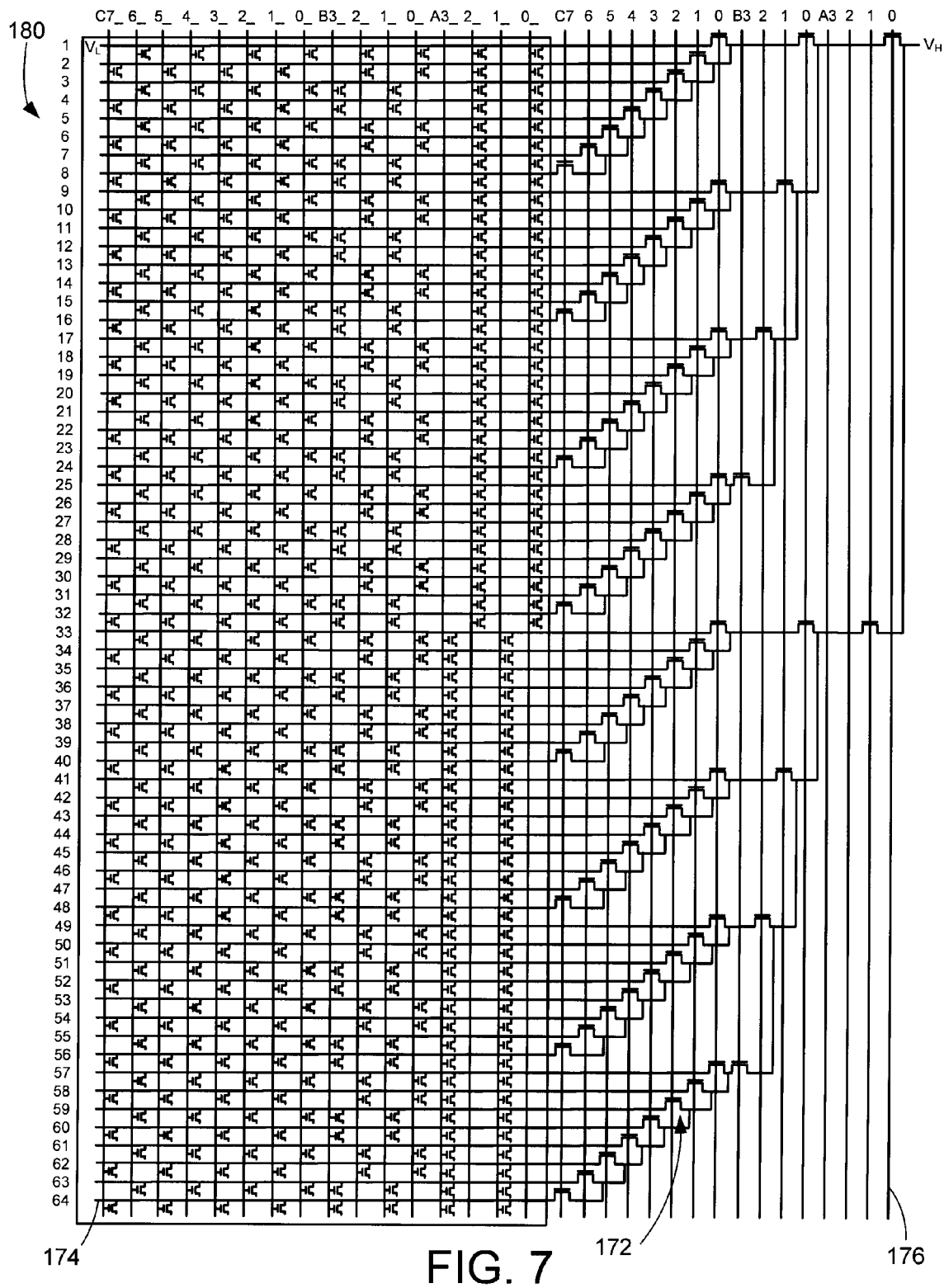
FIG. 7 shows yet another alternative configuration for the switching circuit of FIG. 2.

FIG. 7 shows another exemplary switching circuit 170 in accordance with some embodiments. The switching circuit 170 operates in substantially the same manner as set forth above. The circuit in FIG. 7 shows a full complement of switching devices 172 to accommodate a total of 64 ($2^6$) output lines 174 using 2×2×3 subgroups of input lines 176. The input lines are arranged into A, B and C subgroups, with inputs A0-A3, B0-B3 and C0-C7.

In some embodiments, the circuit 170 can be utilized as a module to handle 64 word lines (or other control lines) out of a greater number of word lines. For example, a total of 16 separate modules 170 as shown in FIG. 7 could be placed adjacent one another and separately addressed to accommodate the 1024 word lines in FIG. 6.

As mentioned previously, the various decoding and switching circuits discussed herein are readily adaptable for use in decoding either row or column addresses for individual cells in a memory layer, such as for the X and Y decoder circuits 112, 114 in FIG. 1. The characterization of the output lines as word lines in FIG. 6, for example, can be readily be adapted for use as the X decoder circuit when the word lines are arranged along the rows of cells in the respective memory layers.

Special considerations may come into play, however, in certain Y (column) decoding configurations, where multiple sets of control lines are provided along each column. For example, the memory cells in each column may be connected between parallel, spaced apart bit lines (BL) and source lines (SL) which require separate selection depending on the desired direction of current through the cells.

Figure 8A:
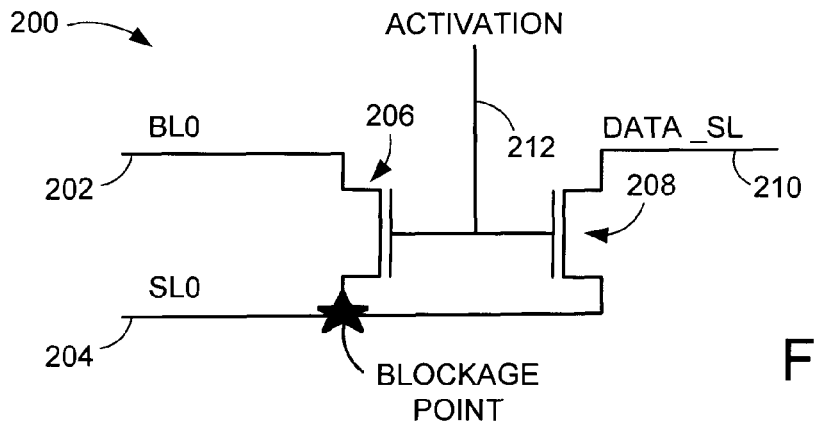
FIG. 8A illustrates a potential conflict for Y decoding configurations.

FIG. 8A shows a circuit 200 with a first bit line 202 (BL0) and a first source line 204 (SL0) interconnected via an intervening switching device 206. The source line SL0 is further connected to a second switching device 208 coupled to a data source line 210. The data source line 210 is intended to provide driving current that is passed along the SL0 line to the appropriate cell. An activation line 212 places the respective switching devices 206, 208 into a conductive state. It can be seen in certain circumstances that a conflict (blockage point) may occur between signals on the BL0 and SL0 at the starred node due to the operation of device 206.

Figure 8B:
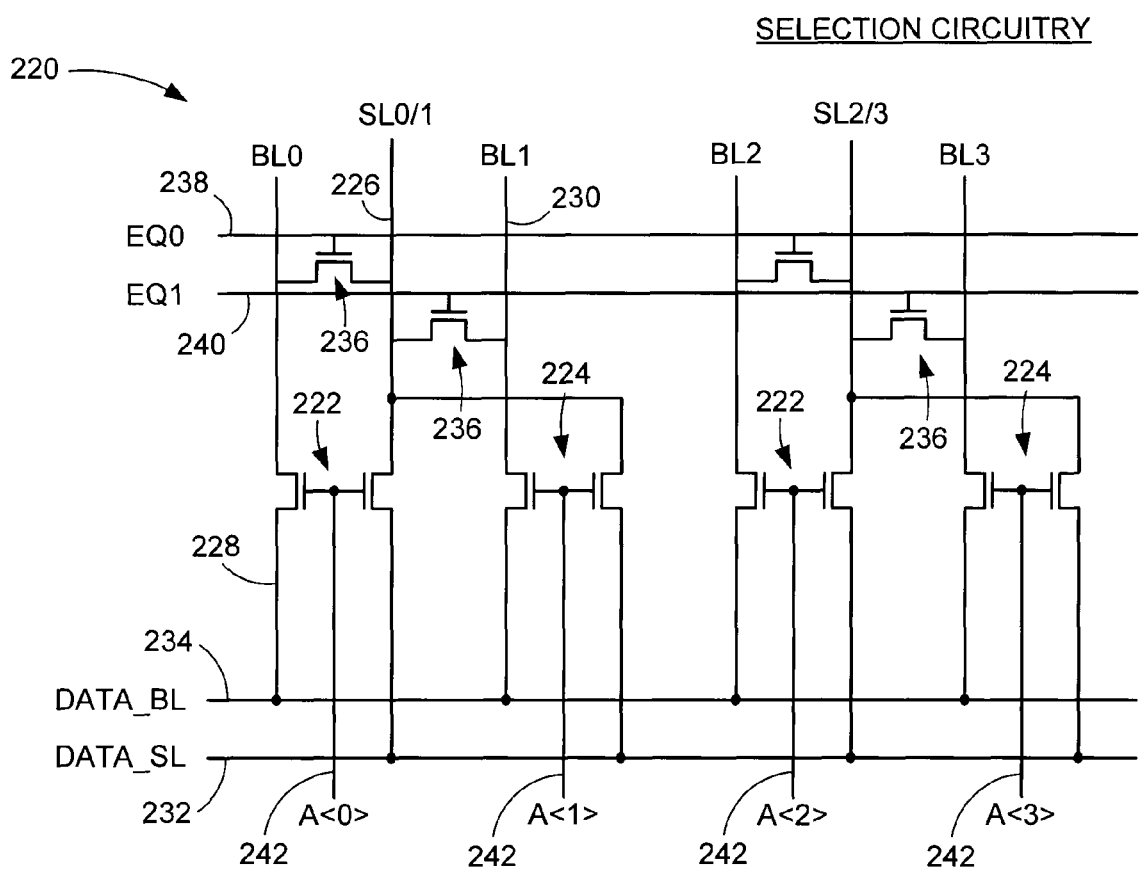
FIG. 8B shows a schematic representation of selection circuitry that can be used to resolve conflicts as set forth by FIG. 8A.

Accordingly, FIG. 8B shows a selection circuit 220 that can be coupled to the switching circuitry discussed above to resolve such conflicts between bit line and source line selection. The selection circuit 220 has first and second parallel switch pairs 222 and 224 each connected to a selection line 226 and a first and second bit line 228 and 230, respectively, while being coupled to a data source line 232. The first and second bit lines 228 and 230 are further connected to a data bit line 234 as well as a switching device 236 that is tied to the selection line 226 and controlled by either a first or second equalization line 238 or 240.

Such structure provides advantageous operation of preventing signals to contradict one another by passing signals through switching devices 236 and parallel switches 222 or 224. The equalization lines 238 and 240 further provide assistance in preventing signal contradiction by selectively allowing signals from passing to and from the selection line 226 to either bit line 228 or 230.

Figure 9:
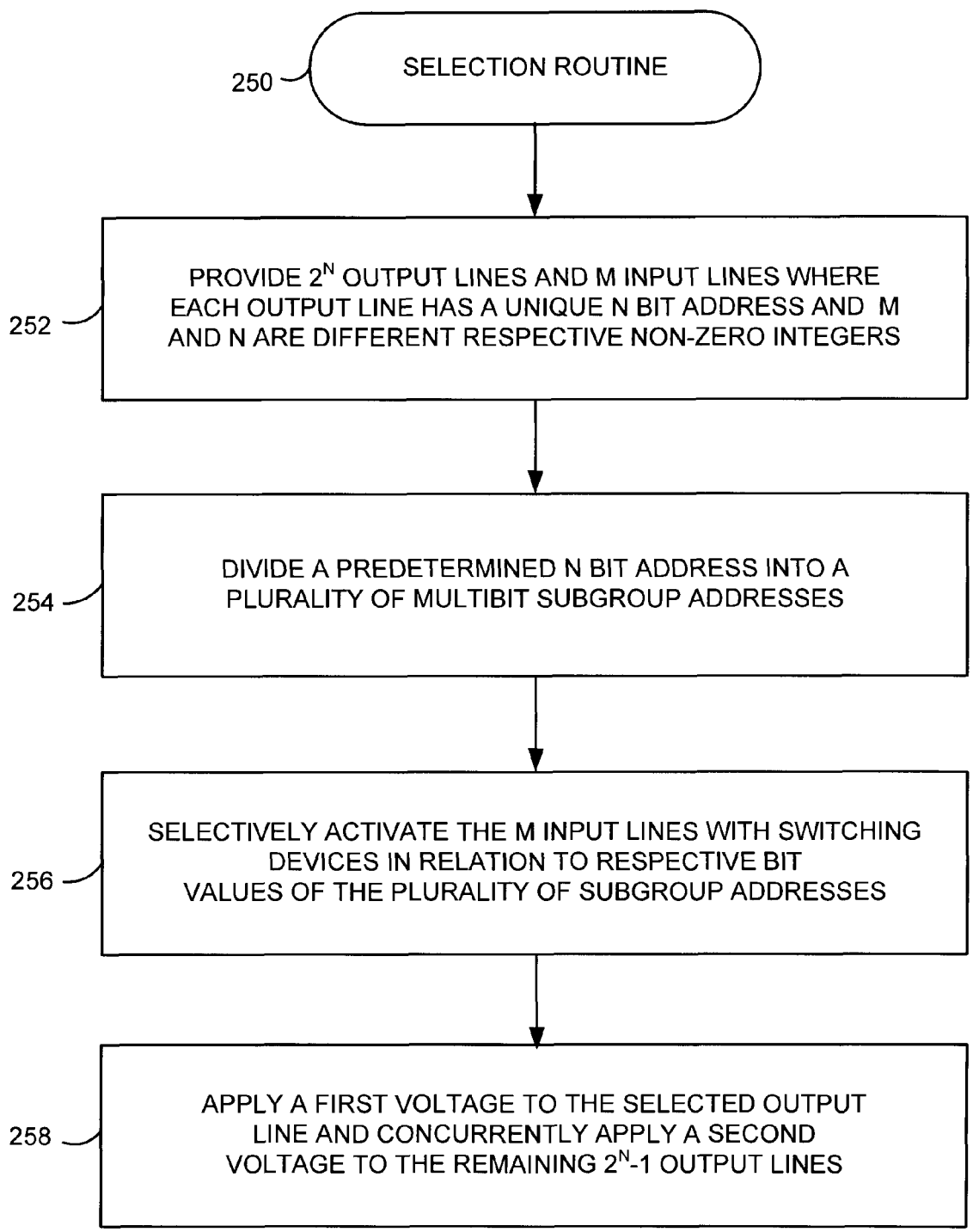
FIG. 9 provides a flowchart of an exemplary SELECTION ROUTINE carried out in accordance with various embodiments of the present invention.

FIG. 9 provides a flowchart of an exemplary selection routine 250 carried out in accordance with various embodiments of the present invention. It will be appreciated that various steps can be omitted and other, additional steps can be included depending on the requirements of a given application.

Initially, a switching circuit is provided at step 252 with $2^N$ output lines and M input lines. Each output line in this step has a unique N bit address and the number of M input lines and N bits are different non-zero integers. In some embodiments, the input lines are configured in a first stage hierarchical structure while having a second stage hierarchical structure with control lines operating in a complementary fashion with respect to the input lines.

Step 254 utilizes a decoder circuit to divide the N bit address of a selected output line into a plurality of multibit subgroup addresses. Various embodiments of the present invention correlate the multibit subgroup addresses with multibit subgroups that consist of a predetermined number of input lines. Such multibit groups can also have a corresponding complementary multibit group that comprises control lines as part of the second stage hierarchical structure.

In step 256, the M input lines are selectively activated with switching devices in response to the respective bit values of the plurality of subgroup addresses. Such selective activation can be carried out in step 258 by applying a first voltage (such as $V_{DD}$) to the selected output line and concurrently applying a second voltage (such as ground) to the remaining $2^N-1$ output lines. The selection routine 250 can, in some embodiments, selectively activate a particular output line by activating the switching devices of the first stage hierarchical structure while deactivating the switching devices of the second stage hierarchical structure.

As can be appreciated by one skilled in the art, the various embodiments illustrated herein provide advantages in both semiconductor decoding circuit efficiency and complexity due to the simplification of the number of input lines needed to address a particular output line. The use of fewer input lines allows for the selection of a desired output line with less time and processing being occupied. Moreover, manufacturing accuracy can be greatly improved by reducing the complexity associated with the various manufacturing methods, such as vertical semiconductor layers. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising:
a switching circuit comprising an array of switching devices coupled to $2^N$ output lines and M input lines, wherein M and N are respective non-zero integers and each output line has a unique N-bit address; and
a decoder circuit coupled to the switching circuit which divides the N-bit address for a selected output line into a plurality of multi-bit subgroup addresses, and asserts the M input lines in relation to respective bit values of said subgroup addresses to apply a first voltage to the selected output line and to concurrently apply a second voltage to a remaining $2^N-1$ output lines.

2. The apparatus of claim 1, wherein the $2^N$ output lines and M input lines are configured in a first stage hierarchical structure of switching devices that is configured to selectively apply the first voltage to the selected output line.

3. The apparatus of claim 2, wherein the $2^N$ output lines are further configured in a second stage hierarchical structure of switching devices that is configured to selectively apply the second voltage to the remaining $2^N-1$ output lines.

4. The apparatus of claim 2, wherein each of the switching devices of the first hierarchical structure is connected only to a single input line and a single output line.

5. The apparatus of claim 1, wherein a base ten number of input lines in the M input lines are provided for each of the multi-bit subgroup addresses in relation to the number of bits in each said multi-bit subgroup address.

6. The apparatus of claim 1, wherein the switching devices are characterized as vertically stacked metal oxide semiconductor field effect transistors (MOSFETs).

7. The apparatus of claim 1, wherein each multi-bit subgroup address corresponds to a predetermined number of input lines less than the M number of input lines.

8. The apparatus of claim 1, wherein the output lines are coupled to a vertical decoding circuit comprising a plurality of parallel switches connected to an equalization line and selectively activated by the output lines to prevent a plurality of data signals from inadvertently contradicting one another.

9. The apparatus of claim 1, further comprising a solid state memory (SSM) array comprising a plurality of memory cells arranged into rows and columns, wherein the output lines are characterized as word lines connected to gate regions of switching devices of the memory cells along each row.

10. The apparatus of claim 1, wherein the first voltage is a positive voltage of selected magnitude and the second voltage is an electrical ground.

11. An apparatus comprising:
a solid state memory (SSM) array comprising a plurality of memory cells arranged into rows and columns;
a decoder circuit;
a switching circuit comprising an array of switching devices;
$2^N$ output lines connected between the switching circuit and the array; and
M input lines connected between the switching circuit and the decoder, wherein M and N are respective non-zero integers and each output line has a unique N-bit address, wherein the decoder divides the N-bit address for a selected output line into a plurality of multi-bit subgroup addresses and asserts the M input lines in relation to respective bit values of said subgroup addresses, and the switching circuit operates responsive to the asserted input lines to apply a first voltage to the selected output line and to concurrently apply a second voltage to a remaining $2^N-1$ output lines.

12. The apparatus of claim 11, wherein the output lines are characterized as word lines connected to gate regions of switching devices of the memory cells along each row.

13. A method comprising:
providing a switching circuit comprising an array of switching devices coupled to $2^N$ output lines and M input lines where M and N are respective non-zero integers and each output line has a unique N bit address;
dividing the N-bit address for a selected output line into a plurality of multi-bit subgroup addresses; and
selectively asserting the M input lines in relation to said subgroup addresses to apply a first voltage to the selected output line and to concurrently apply a second voltage to a remaining $2^N-1$ output lines.

14. The method of claim 13, wherein the output lines and input lines are configured in a first stage hierarchical structure of switching devices that is configured to selectively activate a selected first output line in response to the input lines.

15. The method of claim 13, wherein the switching devices are characterized as vertically stacked metal oxide semiconductor field effect transistors (MOSFETs).

16. The method of claim 13, wherein each multi-bit sub-group address corresponds to a predetermined number of input lines less than the M number of input lines.

17. The method of claim 13, wherein the output lines are coupled to a vertical decoding circuit comprising a plurality of parallel switches connected to an equalization line and selectively activated by the output lines.

18. The method of claim 13, wherein the providing step further comprises coupling the $2^N$ output lines to a solid state memory (SSM) array comprising a plurality of memory cells arranged into rows and columns, wherein the $2^N$ output lines are characterized as word lines connected to gate regions of switching devices of the memory cells along each row.

19. The method of claim 13, wherein the first voltage is a positive voltage of a selected magnitude and the second voltage is an electrical ground.

20. The method of claim 13, wherein M is greater than N, and M is less than $2^N$.

* * * * *